United States Patent [19]

Romo

[11] 4,202,218
[45] May 13, 1980

[54] BRIDGE CIRCUIT

[75] Inventor: Edgar A. Romo, Costa Mesa, Calif.

[73] Assignee: International Telephone and Telegraph Corporation, New York, N.Y.

[21] Appl. No.: 919,966

[22] Filed: Jun. 28, 1978

Related U.S. Application Data

[63] Continuation-in-part of Ser. No. 837,452, Sep. 28, 1977, abandoned.

[51] Int. Cl.² .......................... G01B 7/18; G01L 9/04
[52] U.S. Cl. .................................... 73/766; 73/708
[58] Field of Search ......................... 73/765, 766, 708

[56] References Cited

U.S. PATENT DOCUMENTS

| | | | |
|---|---|---|---|
| 3,910,106 | 10/1975 | Brady | 73/765 X |
| 3,956,927 | 5/1976 | Pearson | 73/766 |
| 3,967,188 | 6/1976 | Spencer | 73/766 X |

*Primary Examiner*—Charles A. Ruehl
*Attorney, Agent, or Firm*—A. Donald Stolzy

[57] ABSTRACT

A circuit including a strain gage bridge having a constant current supply at a constant temperature and otherwise variable with temperature. Linearization and accuracy are obtained through a feedback connection. The constant current and temperature compensation features and common mode rejection are also employed to improve accuracy.

18 Claims, 3 Drawing Figures

BRIDGE CIRCUIT

BACKGROUND OF THE INVENTION

This application is a continuation-in-part of copending application Ser. No. 837,452 filed Sept. 28, 1977, now abandoned, of the same title and assigned to the same assignee. The benefit of the said filing date is claimed for the common subject matter.

This invention relates to a bridge having an element connected therein, the resistance of which changes with some variable, and more particularly to a strain gage bridge or the like.

In the past, strain gage bridge circuits have suffered from inaccuracies due to asymmetrical strain gages, amplifier distortion, and other non-linearities.

PRIOR ART STATEMENT

The voltage regulator disclosed in this application may be similar to or identical to voltage regulator 127 disclosed in U.S. Pat. No. 3,725,665, issued Apr. 3, 1973.

The utility of the invention of this application may include but not be limited to a combination where the circuit of the invention is substituted for that shown in FIG. 4 of U.S. Pat. No. 3,722,264 issued Mar. 27, 1973.

Regarding U.S. Pat. No. 3,532,869 issued Oct. 6, 1970, see the abstract.

Regarding U.S. Pat. No. 3,161,821 issued Dec. 15, 1964, note amplifiers 11, 11', 15, 15', 34 and 42.

Regarding U.S. Pat. No. 3,434,343 issued Mar. 25, 1969, note column 3, line 46 et seq.

Regarding U.S. Pat. No. 3,518,886 issued July 7, 1970, see circuit 19 in FIG. 1.

Regarding U.S. Pat. No. 3,568,044 issued Mar. 2, 1971, see resistor 42.

Regarding U.S. Pat. No. 3,841,150 issued Oct. 15, 1974, see the abstract and resistor 77 in FIG. 3.

Regarding U.S. Pat. No. 3,847,017 issued Nov. 12, 1974, see amplifiers A3 and A4.

Regarding U.S. Pat. No. 3,967,188 issued June 29, 1976, see the abstract.

SUMMARY OF THE INVENTION

In accordance with the present invention the failure of the prior art to compensate for changes in resistance in a Wheatstone bridge is overcome by providing current to the bridge which does not vary with the resistance of the bridge.

Another feature of the invention resides in the use of a high gain differential amplifier which maintains the bridge current constant and accurate to, for example, within 0.0002 percent.

BRIEF DESCRIPTION OF THE DRAWINGS

In the accompanying drawings which illustrate exemplary embodiments of the present invention.

DESCRIPTION OF THE PREFERRED EMBODIMENT

Figure 1:
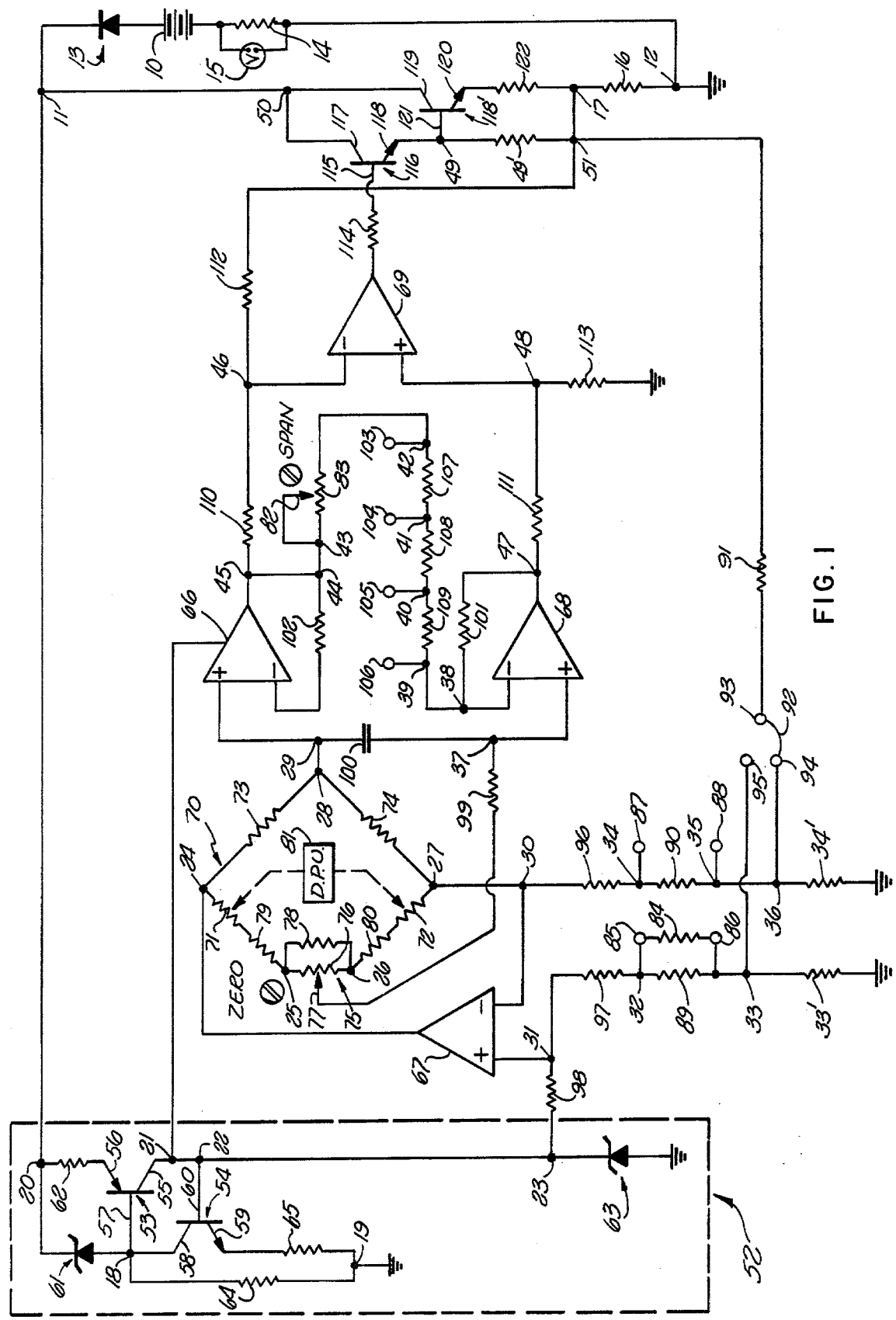
FIG. 1 is a schematic diagram of the circuit of the present invention.

In the drawings, a battery is provided at 10 connected to input junctions 11 and 12 through diode 13 and resistor 14, respectively. Diode 13 is poled to be conductive from a positive pole of battery 10 to junction 11.

Battery 10 has a negative pole connected to junction 12 through resistor 14. A voltmeter calibrated in differential pressure is provided at 15 and connected in parallel with resistor 14. The lead between battery 10 and diode 13 may be very long, if desired. The same is true of the lead from resistor 14 to junction 12.

Junction 12 is connected to ground. An output resistor is provided at 16 connected from a junction 17 to junction 12. Other junctions are connected through the figure as follows. There is a junction 18, a junction 19, a junction 20, a junction 21, a junction 22, a junction 23, a junction 24, a junction 25, a junction 26, a junction 27, a junction 28, a junction 29, a junction 30, a junction 31, a junction 32, a junction 33, a junction 34, a junction 35, a junction 36, a junction 37, a junction 38, a junction 39, a junction 40, a junction 41, a junction 42, a junction 43, a junction 44, a junction 45, a junction 46, a junction 47, a junction 48, a junction 49, a junction 50 and a junction 51 shown in the drawing.

The circuitry found in dotted box 52 is a voltage regulator which, if desired, may be conventional. Transistors are provided at 53 and 54. Transistor 53 has a collector 55, an emitter 56 and a base 57. Base 57 is connected form junction 18. Transistor 54 has a collector 58, an emitter 59 and a base 60. A zener diode is provided at 61 connected between junctions 18 and 20. A resistor 62 is provided connected from junction 20 to emitter 56. Collector 55 is connected to junction 21. Junctions 21, 22 and 23 are connected together. A zener diode 63 is connected from junction 23 to ground. A resistor 64 is connected from junction 18 to junction 19. Junction 19 is connected to ground. Base 60 is connected from junction 22. A resistor 65 is connected from emitter 59 to junction 19. Collector 58 is connected from junction 18.

Junction 20 is connected from junction 11. Voltage regulator 52 acts as a source of potential for a differential amplifier 66 connected from junction 21 in voltage regulator 52.

Differential amplifiers are also provided at 67, 68 and 69. A strain gage bridge is provided at 70. Strain gages are provided at 71 and 72. Resistors are provided at 73 and 74. A potentiometer is provided at 75 having a winding 76 and a wiper 77. The potential of wiper 77 is one corner of the bridge 70. The other corners are the junctions 24, 27 and 28. A resistor 78 is connected parallel with winding 76. Auxiliary resistors are provided at 79 and 80. A conventional differential pressure unit is provided at 81 to stress strain gages 71 and 72 so that voltmeter 15 can be calibrated in differential pressure. The differential pressure unit 81 may be of the prior art type described hereinbefore. The position of wiper 77 provides a zero adjustment. The position of wiper 82 of a variable resistor 83 provides a span adjustment.

A temperature compensating resistor is provided at 84 connected between terminals 85 and 86. Terminals 85 and 86 are, in turn, connected to junctions 32 and 33, respectively. Depending upon the algebraic sign of the temperature correction needed, resistor 84 is connected as shown or between terminals 87 and 88 connected to junctions 34 and 35. A resistor 89 is connected between junctions 32 and 33. A resistor 90 is connected between junctions 34 and 35. Linearity through feedback is provided at one of the junctions 33 and 36. As shown, the feedback is provided through a resistor 91 and a jumper 92 between terminals 93 and 94 to junction 36.

In its other position, jumper 92 is connected from terminal 93 to a terminal 95. Resistor 91 is connected from junction 51. Junctions 27 and 30 are connected together. A resistor 96 is connected between junctions 30 and 34. The inverted input of amplifier 67 is connected from junction 30. A resistor 97 is connected between junctions 31 and 32. A resistor 98 is connected between junctions 23 and 31. The non-inverting input of amplifier 67 is connected from junction 31.

With no change in temperature, or with a change in temperature, the amplifier 67 keeps the current at the output thereof and from junction 27 to junction 30 constant. The gain of amplifier 67, as is conventional, may be anywhere from 100,000 or less to 500,000 or more. This means that junction 30 is always driven to the potential of junction 31.

If strain gages 71 and 72 are not symmetrical, the constant current drive of amplifier 67 still maintains the output thereof accurate. The circuit connected from wiper 77 and junction 28 is, for the most part, a common mode rejection circuit which also improves accuracy. A resistor 99 is connected from wiper 77 to junction 37. A capacitor 100 is connected between junctions 29 and 37. Junctions 28 and 29 are connected to the noninverting input of amplifier 66. Amplifier 68 has a feedback resistor 101. Amplifier 66 has a feedback resistor 102. Junction 45 is connected from the output of amplifier 66. Resistor 102 is connected from junction 44 to the inverting input of amplifier 66. Junctions 44 and 45 are connected together. Junctions 43 and 44 are connected together. Variable resistor 83 is connected from junction 43 to junction 42. Terminals 103, 104, 105 and 106 are connected respectively from junctions 42, 41, 40 and 39, so that resistors 107 and/or 108 and/or 109 may be shorted or opened.

Feedback resistor 101 is connected between junctions 38 and 47. The output of amplifier 68 is connected to junction 47. The noninverting input of amplifier 68 is connected from junction 37. The inverting input of an amplifier 68 is connected from junction 38. Junctions 38 and 39 are connected together. A resistor 110 is connected from junction 45 to junction 46. A resistor 111 is connected from junction 47 to junction 48. A resistor 112 is connected from junction 46 to junction 51. Junctions 17 and 51 are connected together. A resistor 113 is connected from junction 48 to ground. The inverting and noninverting inputs of amplifier 69 are respectively connected from junctions 46 and 48.

A resistor 114 is connected from the output of amplifier 69 to a base 115 of a transistor 116 having a collector 117 and an emitter 118. Collector 117 is connected to junction 50. Junctions 11 and 50 are connected together. Another transistor is provided at 118' having a collector 119, an emitter 120 and a base 121. Emitter 118 is connected to junction 49. Base 121 is connected from junction 49. Collector 119 is connected from junction 50. A resistor 122 is connected from collector 120 to junction 17. A resistor 49' is connected between junctions 49 and 51. Resistors 33' and 34' have a resistance normally substantially less than that of resistors 97 and 96, respectively.

Some circuit component values are listed in the following:

| Resistors | |
|---|---|
| 14 | 10 ohms |
| 33' | 200 ohms |
| 34' | 200 ohms |
| 49' | 4,700 ohms |
| 62 | 1,500 ohms |
| 64 | 22 megohms |
| 65 | 20,000 ohms |
| 73 | 7,500 ohms |
| 74 | 7,500 ohms |
| 78 | 10 ohms |
| 96 | 3,200 ohms |
| 97 | 10,000 ohms |
| 98 | 10,000 ohms |
| 99 | 2,200 ohms |
| 101 | 75,000 ohms |
| 102 | 75,000 ohms |
| 107 | 5,000 ohms |
| 108 | 5,000 ohms |
| 109 | 5,000 ohms |
| 110 | 75,000 ohms |
| 111 | 75,000 ohms |
| 112 | 75,000 ohms |
| 113 | 75,000 ohms |
| 114 | 220 ohms |
| 122 | 22 ohms |
| Winding | |
| 76 | 100 ohms |

Figure 3:
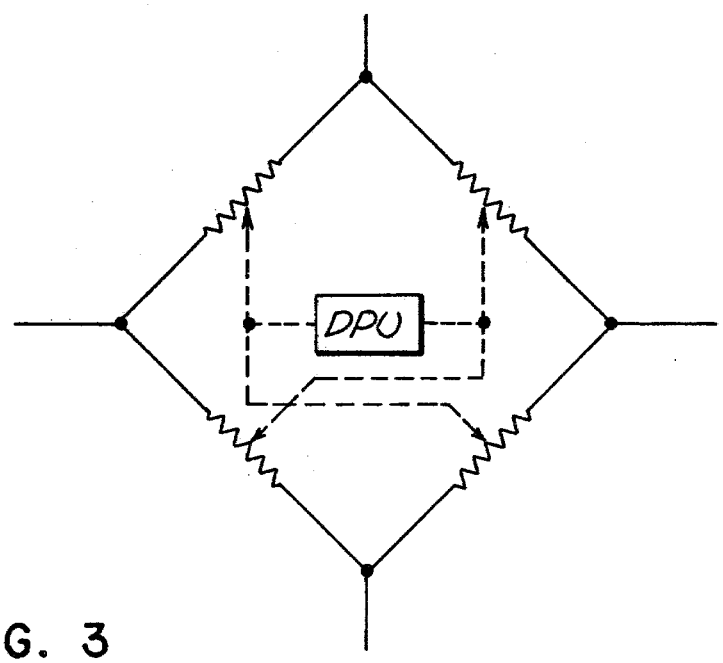
FIG. 3 is a schematic diagram of an alternative embodiment of the present invention.

In FIG. 3, oppositely disposed strain gages are fixed to the same side of a conventional cantilevered beam. For example, see U.S. Pat. No. 3,518,886 issued July 7, 1970.

OPERATION

As stated previously, voltage regulator 52 may be conventional and may operate in the same manner as that disclosed in the said U.S. Pat. No. 3,725,665.

The present invention can utilize two strain gages 71 and 72 in the same or a manner similar to that disclosed in U.S. Pat. No. 3,722,264 as aforesaid. In this patent it will be recognized that when one strain gage is in tension, the other is in compression, and vice versa, as is well known. This means that the resistance of the tension gage increases and that of the compression gage decreases.

Note that the resistance between junctions 24 and 27 may change with temperature. Resistor 84 supplies a zero temperature adjustment. Feedback from junction 51 through resistor 91 keeps the output voltage across resistor 14 linear with the conventional strain gage beam of DPU 81, and accurate with the differential pressure within DPU 81. The strain-resistance function of gages 71 and 72 and their beam are not quite linear and the feedback compensates for this.

Except for feedback and temperature sensitive resistor 84, resistor 98 through junction 31 to ground is a voltage divider which determines the noninverting input voltage of differential amplifier 67. The same is true of the inverting input connected through junction 30 to resistor 34' to ground.

As stated previously, as is well known, amplifier 67 may have a gain of 500,000 and will therefore drive its inverting input to within, for example, 0.5 millionth of the voltage of its noninverting input. The noninverting input is essentially constant except for a possible temperature and/or feedback connection.

Resistor 84 supplies a zero temperature correction, as aforesaid. The dynamic temperature correction is supplied by amplifier 67 which keeps the current between junctions 27 and 30 constant and equal to the output current of amplifier 67 to bridge 70. As is well known, the input impedances of amplifiers, such as amplifiers 66, 67, 68 and 69, are so high (in the megohm range or above) that the current between junctions 28 and 29, and from wiper 77 through resistor 99 may be neglected.

In accordance with the foregoing, under strain, gage 71 is in tension when gage 72 is in compression or vice versa. Amplifiers 66 and 68 act as a common mode rejection circuit and cancel out common nonlinearities in the amplifiers and changes therein due to temperature. Note that one side of the bridge, junction 28, is connected to amplifier 66, and the other side (wiper 77) is connected to amplifier 68 through resistor 99 and junction 37.

Amplifier 69 then takes the difference between the outputs of amplifiers 66 and 68. The reason for this is, as is well known, the output of the bridge should be proportional to the difference between the voltages at junction 28 and wiper 77.

Transistors 116 and 118′ form a Darlington circuit, known for many years, that has an output current through and a voltage across resistor 16 which is directly proportional to the output voltage of amplifier 69, which is also well known.

The constant current at the output of amplifier 67 solves the temperature change problem. If the voltage between junctions 24 and 27 were constant, a change in the bridge temperature would cause the currents in the bridge legs to vary. This would cause the potential of wiper 77 to vary erroneously because the current of the leg including strain gage 72 would change and the voltage across that leg would vary. There is no compensation at junction 28 because the resistance of 73 is equal to that of 74 and the voltage at 28 is always half the constant voltage between junctions 24 and 27.

On the other hand, with a constant output current from amplifier 67, the currents in all legs remain constant (remember the amplifiers 66 and 68 take negligible input current because of their high input impedances). See also the algebraic proof, infra.

If the sum of the resistances in the leg of gage 71 is $R_a$, the sum of those in the leg of gage 72 is $R_b$, the resistance of resistor 73 is $R_c$, and the resistance of resistor 74 is $R_d$, the voltage drop from wiper 77 to the potential of junction 28 is $$e_o = i_{ab}R_b - i_{cd}R_d \qquad (1)$$

Figure 2:
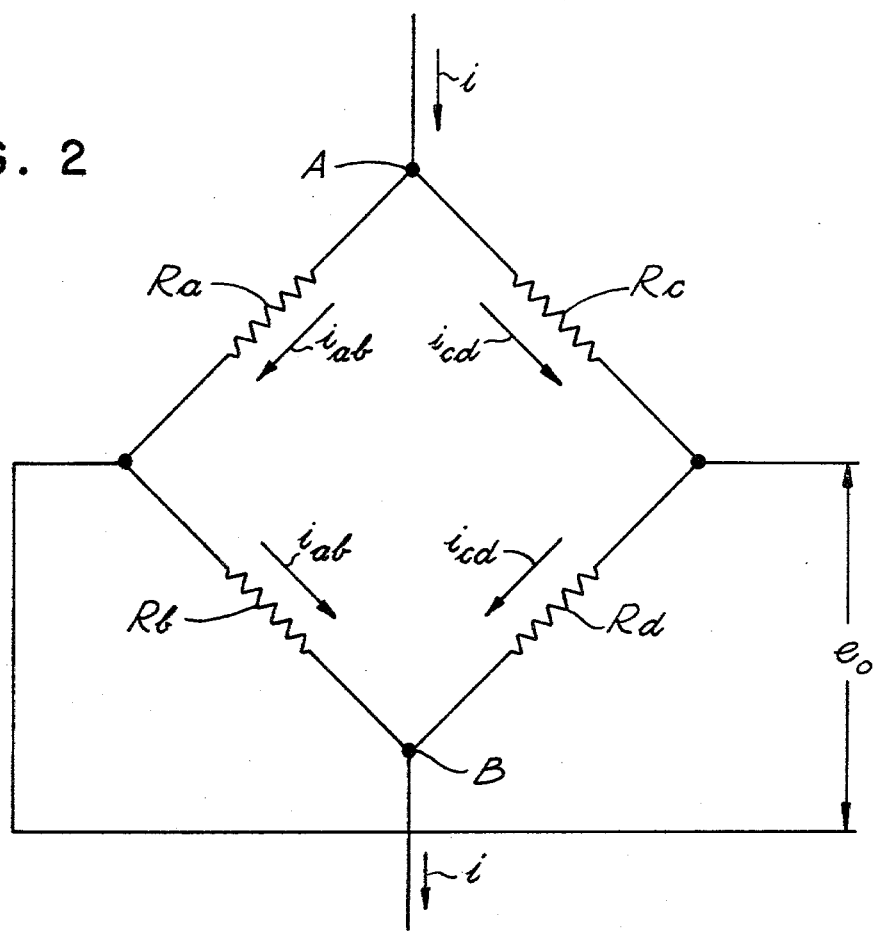
FIG. 2 is a schematic diagram of a Wheatstone bridge.

See FIG. 2.

$$i_{ab} = \frac{e}{R_a + R_b} \qquad (2)$$

where e is the voltage drop from junction A in FIG. 2 to junction B (note e is variable and i is constant).

$$i_{cd} = \frac{e}{R_c + R_d} \qquad (3)$$

$$e = \frac{i(R_a + R_b)(R_c + R_d)}{R_a + R_b + R_c + R_d} \qquad (4)$$

$$e_o = \frac{eR_b}{R_a + R_b} - \frac{eR_d}{R_c + R_d} \qquad (5)$$

$$\frac{e_o}{i} = \frac{R_b(R_c + R_d) - R_d(R_a + R_b)}{(R_a + R_b)(R_c + R_d)} \qquad (6)$$

$$\times \frac{(R_a + R_b)(R_c + R_d)}{R_a + R_b + R_c + R_d}$$

$$\frac{e_o}{i} = \frac{R_bR_c - R_dR_a}{R_a + R_b + R_c + R_d} \qquad (7)$$

As is conventional $R_c$ may be equal to $R_d$ and both may be temperature insensitive.

Equation (7) may thus be rewritten $$\frac{e_o}{i} = \frac{R_b - R_a}{\frac{R_a}{R_c} + \frac{R_b}{R_c} + 2} \qquad (8)$$

If $R_c >> R_a$ \qquad (9)

and $R_c >> R_b$ \qquad (10)

$$\frac{e_o}{i} = \frac{R_b - R_a}{2} \qquad (11)$$

If $R_b = R_{bo}(1 + \alpha_b \Delta T)$ \qquad (12)

and $R_a = R_{ao}(1 + \alpha_a \Delta T)$ \qquad (13)

(Common equations for resistance versus temperature difference $\Delta T$ from a reference, $\alpha_b$ and $\alpha_a$ being constant, $R_{bo}$ and $R_{ao}$ being resistances at the reference temperature).

$$\frac{2e_o}{i} = (R_{bo} - R_{ao}) + (R_{bo}\alpha_b\Delta T - R_{ao}\alpha_a\Delta T) \qquad (14)$$

Thus if the leg resistance $R_{bo}$ is equal to the leg resistance $R_{ao}$ (need not be—may be zero corrected in the output circuit) and $$R_{bo}\alpha_b = R_{ao}\alpha_a \qquad (15)$$

$$\frac{e_o}{i} = \frac{R_{bo} - R_{ao}}{2} \qquad (16)$$

$R_{bo}$ and $R_{ao}$ are *constant and independent of temperature* and their difference is what $e_o$ measures. The said difference is that sought for as a linear function of differential pressure. Note gate i is constant.

The phrase "matched legs" is hereby defined for use herein and in the claims to mean Wheatstone bridge strain gages or the like constructed in accordance with equation (15).

Note what happens when $$e = E \qquad (17)$$

and E is a constant voltage.

From equation (5)

$$\frac{e_o}{E} = \frac{R_bR_c - R_dR_a}{(R_a + R_b)(R_c + R_d)} \qquad (18)$$

However in this case, the temperature sensitive $R_a$ and $R_b$ do not drop out in the denominator of (18) even if $R_c = R_d$ \qquad (19)

and $R_c >> R_a$ \qquad (20)

and $R_c >> R_b$ \qquad (21)

The same is true of the four strain gages in the alternative embodiment of FIG. 3 and even if all four bridge legs are matched and have equal resistances at a single reference temperature.

Applying equation (18) to FIG. 3, let us define $R_b$ and $R_c$ as tension gage legs, $R_a$ and $R_d$ as compression gage legs so that, from stress only, resistance changes $\Delta R$ $$R_b = R_c = R + \Delta R \tag{22}$$

$$R_a = R_d = R - \Delta R \tag{23}$$

From equation (18)

$$\frac{e_o}{E} = \frac{(R + \Delta R)^2 - (R - \Delta R)^2}{4(R + \Delta R)^2} \tag{24}$$

$$\frac{E_o}{E} = \frac{R \Delta R}{(R + \Delta R)} \tag{25}$$

Equation (25) shows that if E is constant, $\Delta R$ is not linear with $e_o$ for all values of R and $\Delta R$.

Even if $R \gg \Delta R$ $$\frac{e_o}{E} = \frac{\Delta R}{R} \tag{26}$$

and $e_o$ is a function of changes in R due to temperature changes. Note $\Delta R$ is not a function of temperature, but only a function of strain.

On the other hand, using constant current i, from equation (7)

$$\frac{e_o}{i} = \frac{(R + \Delta R)^2 - (R - \Delta R)^2}{4R} \tag{27}$$

$$\frac{e_o}{i} = \Delta R \tag{28}$$

Thus, with constant current i, equation (28) *is independent of the effect of temperature on R.*

What is claimed is:

1. A detector circuit comprising: a Wheatstone bridge having first, second, third and fourth corner junctions; a first leg connected between said fourth and first corner junctions; a second leg connected between said first and second corner junctions; a third leg connected between said second and third corner junctions; a fourth leg connected between said third and fourth corner junctions; a main differential amplifier having inverting and noninverting inputs, and an output; first means to supply a voltage to said main differential amplifier noninverting input regulated with respect to ground, said main differential amplifier output being connected to said second corner junction, said fourth corner junction being connected to said main differential amplifier inverting input; second means providing resistance connected from said fourth corner junction to ground, the current from the output of said main differential amplifier being constant when the resistance of any of said legs changes; output means connected from said first and third corner junctions; and utilization means connected from said output means.

2. The invention as defined in claim 1, wherein said first and second legs include first and second strain gages, a differential pressure unit being provided to put one of said first and second legs in compression while putting the other thereof in tension, said utilization means including a meter calibrated in differential pressure.

3. The invention as defined in claim 1, wherein said first and second means include at least first and second resistors, respectively, said first resistor being connected from said main differential amplifier noninverting input to ground, said second resistor being connected from said fourth corner junction to ground.

4. The invention as defined in claim 3, wherein third and fourth resistors are provided and are connected in series with said first and second resistors, respectively, from one end thereof to ground, and a feedback resistor connected from said output means to the ungrounded side of one of said third and fourth resistors, said first, second, third and fourth resistors having resistances $R_1$, $R_2$, $R_3$, and $R_4$, respectively, where $$R_3 \approx R_4,$$

$$R_1 \gg R_3,$$

$$R_2 \gg R_4,$$

and $R_1$ and $R_2$ are the same order of magnitude.

5. The invention as defined in claim 1, wherein one of said first and second means are temperature sensitive.

6. The invention as defined in claim 1, wherein said output means includes a first auxiliary differential amplifier (ADA), and second and third auxiliary differential amplifiers (ADAs), each of the said three of which has a noninverting input, an inverting input, and an output, said first ADA noninverting input being connected from said third corner junction, a first resistor connected from said first corner junction to said second ADA noninverting input, a capacitor connected between the noninverting inputs of said first and second ADAs, second and third resistors connected respectively from the outputs of said first and second ADAs to the respective inverting inputs of said first and second ADAs, a variable resistor connected from the output of said first ADA to the inverting input of said second ADA, a fourth resistor connected from the first ADA output to said third ADA inverting input, a fifth resistor connected from the output of said second ADA to the noninverting input of said third ADA, a sixth resistor connected from the noninverting input of said third ADA to ground, a Darlington pair including first and second transistors each having a collector, an emitter and a base, a seventh resistor connected from the output of said third ADA to said first transistor base, the first transistor emitter being connected to said second transistor base, both of the collectors being connected together, eighth and ninth resistors connected in that order from the second transistor emitter to ground, tenth and eleventh resistors connected respectively from said first transistor emitter and from the inverting input of said third ADA to the ungrounded side of said ninth resistor, a source of D.C. potential, a twelfth resistor connected from said collectors to ground, and a voltmeter calibrated in differential pressure and connected in parallel with said twelfth resistor.

7. A detector circuit comprising: a Wheatstone bridge having first, second, third and fourth corner junctions; a first reference leg connected between said second and third corner junctions, said first leg including a resistor; a second reference leg connected between said third and fourth corner junctions, said second leg including a resistor, both of said first and second reference legs being temperature insensitive; a first active leg connected between said fourth and first corner junctions; a second active leg connected between said first and second corner junctions, said first and second active legs each including a temperature sensitive strain gage; force means to increase the resistance of one strain gage while decreasing the resistance of the other strain gage; a main differential amplifier having inverting and noninverting inputs, and an output; first means to supply a voltage regulated with respect to ground and connected to said main differential amplifier noninverting input, said main differential amplifier output being connected to said second corner junction, said fourth corner junction being connected to said main differential amplifier inverting input; second means providing resistance connected from said fourth corner junction to ground, the current from the output of said main differential amplifier being constant when the sum of the resistances of said first and second active legs changes; output means connected from said first and third corner junctions; and utilization means connected from said output means.

8. The invention as defined in claim 7, wherein the resistance $R_b$ of said first active leg is equal to that $R_a$ of said second active leg at a predetermined reference temperature when said strain gages are unstressed, said first reference leg having a resistance $R_c$ equal to that $R_d$ of said second reference leg, the following condition also being true:

$$R_c >> R_b$$

9. The invention as defined in claim 8, wherein said first and second active legs are matched to the extent that, when said first and second active legs are unstressed, $$R_{bo}\alpha_b = R_{ao}\alpha_a$$

where
$R_b = R_{bo}(1+\alpha_b\Delta T)$
$R_a = R_{ao}(1+\alpha_a\Delta T)$
$R_{bo}$ and $R_{ao}$ are
$R_b$ and $R_a$, respectively, at said predetermined reference temperature,
$\alpha_b$ and $\alpha_a$ are the temperature coefficients of resistance of said first and second active legs, and
$\Delta T$ is the difference between ambient temperature and said predetermined reference temperature.

10. The invention as defined in claim 9, wherein said force means includes a differential pressure unit, aid utilization means including a voltmeter calibrated in differential pressure.

11. The invention as defined in claim 10, wherein said first means includes a regulated voltage source, a first resistor connected from said source to said amplifier noninverting input, third means providing resistance from said amplifier noninverting input to ground including a second resistor having a terminal connected to ground, said second means also having a third resistor connected to ground, a feedback connection from said output means to one of said second and third resistors at a point above ground, one of said second and third means having a temperature sensitive resistor, but otherwise being substantially identical.

12. The invention as defined in claim 7, wherein said first means includes a regulated voltage source, a first resistor connected from said source to said amplifier noninverting input, third means providing resistance from said amplifier noninverting input to ground including a second resistor having a terminal connected to ground, said second means also having a third resistor connected to ground, a feedback connection from said output means to one of said second and third resistors at a point above ground, one of said second and third means having a temperature sensitive resistor, but otherwise being substantially identical.

13. A detector circuit comprising: a Wheatstone bridge having first, second, third and fourth corner junctions; a first leg connected between said second and third corner junctions, said first leg including a strain gage; a second leg connected between said third and fourth corner junctions, said second leg including a strain gage; a third leg connected between said fourth and first corner junctions; a fourth leg connected between said first and second corner junctions, said third and fourth legs each including a strain gage, all of said strain gages being temperature sensitive; force means to increase the resistance of one pair of oppositely disposed strain gages while decreasing the resistance of the other pair; a main differential amplifier having inverting and noninverting inputs, and an output; first means to supply a voltage regulated with respect to ground and connected to said main differential amplifier noninverting input, said main differential amplifier output being connected to said second corner junction, said fourth corner junction being connected to said main differential amplifier inverting input; second means providing resistance connected from said fourth corner junction to ground, the current from the output of said main differential amplifier being constant when the resistance between said second and fourth corner junctions changes; output means connected from said first and third corner junctions; and utilization means connected from said output means.

14. The invention as defined in claim 13, wherein the resistance R of each leg is the same at a predetermined reference temperature when all of said strain gages are unstressed.

15. The invention as defined in claim 14, wherein each of said legs has the same temperature coefficient of resistance.

16. The invention as defined in claim 15, wherein said force means includes a differential pressure unit, said utilization means including a voltmeter calibrated in differential pressure.

17. The invention as defined in claim 16, wherein said first means includes a regulated voltage source, a first resistor connected from said source to said amplifier noninverting input, third means providing resistance from said amplifier noninverting input to ground including a second resistor having a terminal connected to ground, said second means also having a third resistor connected to ground, a feedback connection from said output means to one of said second and third resistors at a point above ground, one of said second and third means having a temperature sensitive resistor, but otherwise being substantially identical.

18. The invention as defined in claim 13, wherein said first means includes a regulated voltage source, a first resistor connected from said source to said amplifier noninverting input, third means providing resistance from said amplifier noninverting input to ground including a second resistor having a terminal connected to ground, said second means also having a third resistor connected to ground, a feedback connection from said output means to one of said second and third resistors at a point above ground, one of said second and third means having a temperature sensitive resistor, but otherwise being substantially identical.

* * * * *